(12) United States Patent
Yamamoto et al.

(10) Patent No.: US 7,780,824 B2
(45) Date of Patent: Aug. 24, 2010

(54) ELECTROPLATING JIG

(75) Inventors: Wataru Yamamoto, Tokyo (JP); Katsunori Akiyama, Tokyo (JP)

(73) Assignee: Yamamoto-Ms Co., Ltd., Tokyo (JP)

( * ) Notice: Subject to any disclaimer, the term of this patent is extended or adjusted under 35 U.S.C. 154(b) by 922 days.

(21) Appl. No.: 11/432,396

(22) Filed: May 12, 2006

(65) Prior Publication Data

US 2006/0283704 A1 Dec. 21, 2006

(30) Foreign Application Priority Data

Jun. 20, 2005 (JP) .............................. 2005-179358

(51) Int. Cl.
B23H 7/26 (2006.01)
(52) U.S. Cl. .............................. 204/297.01; 204/297.03
(58) Field of Classification Search ................. 204/279, 204/280, 285, 286.1, 288.2, 288.3, 297.01, 204/297.03
See application file for complete search history.

(56) References Cited

U.S. PATENT DOCUMENTS 4,906,346 A 3/1990 Hadersbeck et al.
6,547,937 B1 4/2003 Oberlitner et al.
6,627,052 B2 * 9/2003 Fluegel et al. ............ 204/224 R
6,844,274 B2 * 1/2005 Yoshioka et al. ............ 438/800
2002/0029963 A1 3/2002 Yoshioka et al.

FOREIGN PATENT DOCUMENTS

| EP | 0 283 681 | 9/1988 |
|----|-----------|--------|
| EP | 1 386 984 A1 | 2/2004 |
| JP | 05-271990 | 10/1993 |
| JP | 07-066321 | 3/1995 |
| JP | 10-233400 | 9/1998 |
| JP | 11-200096 | 7/1999 |
| JP | 2003-301299 | 10/2003 |
| JP | 2004-140129 | 5/2004 |
| JP | 2004-218011 | 8/2004 |
| JP | 3109711 | 6/2005 |

* cited by examiner

Primary Examiner—Luan V Van
(74) Attorney, Agent, or Firm—Berenato & White, LLC

(57) ABSTRACT

An electroplating jig which includes: a first insulator plate having an aperture; a second insulator plate sandwiching a body to be plated between the first insulator plate and the second insulator plate so that the body to be plated is faced outside from the aperture; and a conductive plate for conducting electric current supplied from outside to the body to be plated, the conductive plate being arranged between the first or second insulator plate and the body to be plated, wherein the conductive plate is formed using a conductive rubber contacting elastically with the body to be plated.

9 Claims, 4 Drawing Sheets

ELECTROPLATING JIG

CROSS REFERENCE TO RELATED APPLICATIONS

This application claims the foreign priority benefit under Title 35, United States Code, §119(a)-(d) of Japanese Patent Applications No. 2005-179358, filed on Jun. 20, 2005, the contents of which are hereby incorporated by reference.

BACKGROUND OF THE INVENTION

1. Field of the Invention

The present invention relates to an electroplating jig used for plating and anodic oxidation on a surface of, for example, a semiconductor wafer, a glass substrate, and a ceramic substrate.

2. Description of the Related Art

In recent years, plating technologies have been applied to various technology fields, and applied to a wiring technology of semiconductor devices too. In a semiconductor field, shrinkage of a wiring pitch of a semiconductor device has been required for achieving high integration and high performance of the device. As one of the wiring technology employed in recent years, there exists a method which fills a wiring material in a wiring groove by plating. The wiring groove is prepared by dry etching process after forming an interlayer dielectric film.

For successfully achieving these plating technologies, a uniform deposition of a plating material in the groove of a body to be plated (hereinafter, referred to as plating body) is essential. Therefore, an electroplating jig which is able to form a uniform plating film on a surface to be plated (hereinafter, referred to as plating surface) of the plating body has been proposed by the inventors of this application. This is disclosed in, for example, Japanese Laid-Open Patent Publication No. 2003-301299.

As shown in FIG. 5, the electroplating jig includes, as major parts, a cathode conductor 101 which supplies electric current to a plating surface of a semiconductor wafer 100 as the plating body, a first insulator 102 (hereinafter, referred to as insulator 102) covering a surface side (a plating surface 100A side) of the semiconductor wafer 100 and supporting the cathode conductor 101, and a second insulator 103 (hereinafter, referred to as back cap 103) covering a back side (an opposite side of the plating surface) of the semiconductor wafer and supporting the semiconductor wafer 100.

Here, the cathode conductor 101 includes a circular plate member 101A designed to surround the semiconductor 100 from a perimeter of the semiconductor, and approximately rectangular power connection plate member 101B which is bonded to the circular plate member 101A at one side and also connected to an external power source (not shown) at the other side. In addition, the circular plate member 101A has a plurality of protruded plate members 101C, 101C, ... which are radially-inwardly protruded on the plating surface 100A side of the semiconductor 100. In each protruded plate member 101C, each of a plurality of convex members 101D, 101D, ... which electrically contacts with a periphery of the plating surface 100A of each semiconductor wafer 100 are disposed.

Meanwhile, in the electroplating jig described in the Japanese Laid-Open Patent Publication No. 2003-301299, each convex member 101D of the cathode conductor 101 made of metal is contacted with the semiconductor 100 by fixing the back cap 103 to the insulator 102 by using a plurality of screws (not shown). Therefore, a load (a pushing force) from each convex member 101D is locally and concentratedly applied to the semiconductor 100. As a result, a contact portion of the semiconductor wafer 100 contacting with each convex member 101D breaks in some case, and also a crack originating from the contact portion of the semiconductor wafer 100 is caused in other case. In particular, in recent years, since a material strength of ultra-thin semiconductor wafer and large diameter semiconductor wafer is weak, the aforementioned problem such as the crack issue has become likely to happen.

The present invention has been made in view of the problems described above. Accordingly, it is an object of the present invention to provide an electroplating jig which has, for example, improved performance and reliability capable of solving issues such as breaking and damaging of a plating body, by preventing the plating body from being applied over-stress even if a conductive plate is contacted with the plating body, such as the ultra-thin semiconductor wafer which has a relatively weak material strength.

SUMMARY OF THE INVENTION

To achieve the foregoing objects, according to a first aspect of the present invention, there is provided an electroplating jig which includes: a first insulator plate having an aperture; a second insulator plate sandwiching a body to be plated (a plating body) between the first insulator plate and the second insulator plate so that the plating body is faced outside from the aperture; and a conductive plate for conducting electric current supplied from outside to the plating body, the conductive plate being arranged between the first insulator plate and the plating body, wherein the conductive plate is formed using a conductive rubber contacting elastically with the plating body.

According to the above configuration, when the plating body is sandwiched between the first insulator plate and the second insulator plate, the conductive plate of conductive rubber works as a cushion for the plating body, and can relax a load (pushing force) applied from the conductive plate to the plating body. As a result, the aforementioned issue of the conventional technology that a local and concentrated load is applied to the plating body can be removed.

According to a second aspect of the present invention, there is provided an electroplating jig, wherein the conductive rubber is a ring or frame shape plate having surface contacting with the plating body, by being arranged so as to surround the aperture of the first insulator plate from a perimeter of the aperture.

According to the above configuration, the conductive rubber of a plane plate can be elastically contacted with a surface of the plating body with wide surface contact. Therefore, the conductive rubber can certainly relax the load applied to the plating body from the conductive rubber. In addition, since a surface to be plated (a plating surface) of the plating body is not covered with the conductive rubber by forming the conductive rubber in the ring or frame shape, the plating surface can be certainly plated.

According to a third aspect of the present invention, there is provided an electroplating jig, wherein an elastic sheet which elastically contacts with the plating body is arranged between the second insulator plate and the plating body.

According to the above configuration, the load applied to the plating body from the conductive plate can be elastically accepted with the elastic sheet, then, the local and concentrated load can further be suppressed by the elastic sheet as a cushion.

According to a fourth aspect of the present invention, there is provided an electroplating jig which includes: a first insulator plate having an aperture; a second insulator plate sandwiching a body to be plated (a plating body) between the first insulator plate and the second insulator plate so that the plating body is faced outside from the aperture; and a conductive plate for conducting electric current supplied from outside to the plating body, the conductive plate being arranged between the second insulator plate and the plating body, wherein the conductive plate is formed using a conductive rubber contacting elastically with the plating body.

According to the above configuration, as with the first aspect of the present invention, when the plating body is sandwiched between the first insulator plate and the second insulator plate, the conductive plate of conductive rubber works as a cushion for the plating body. As a result, a load (pushing force) applied to the plating body from the conductive plate can be relaxed. In addition, since the conductive rubber is formed in a plane plate shape substantially corresponding to the plating body, the conductive rubber can be contacted with surface contact with a whole backside, which is an opposite side of the plating surface, of the plating body. With the above, since electric current is supplied to the whole backside of the plating body, an electric potential difference in the plating body can be suppressed to be small, thereby resulting in suppression of uneven plating within the plating body.

According to a fifth aspect of the present invention, there is provided an electroplating jig, wherein the plating body is any one of a semiconductor wafer, a glass substrate, a ceramic substrate, a print board, and an aluminum substrate.

According to the above configuration, the conductive rubber can be elastically contacted with the semiconductor wafer, or the glass substrate, or the ceramic substrate, or the print board, or the aluminum substrate (hereinafter, collectively called as such as semiconductor wafer). As a result, a pushing force applied to such as a semiconductor wafer from the conductive rubber can be relaxed, thereby resulting in prevention of breaking and damaging of the semiconductor wafer.

According to a sixth aspect of the present invention, there is provided an electroplating jig which further includes: an inner seal arranged on a periphery of the aperture, for sealing between the first insulator plate and the plating body; an outer seal arranged on a perimeter of the conductive rubber, for sealing between the first insulator plate and the second insulator plate; and an air exhaust path disposed at least in one of the first insulator plate and the second insulator plate, for maintaining a space surrounded by the first insulator plate, the second insulator plate, the inner seal, and the outer seal in negative pressure.

According to the above configuration, a space surrounded by the first insulator plate, the second insulator plate, the inner seal and the outer seal is maintained in negative pressure, by connecting a pump to the air exhaust path and exhausting the air in the space. As a result, the whole outer seal can be contacted with the first insulator plate (or the second insulator plate) with a uniform pushing force, while the whole inner seal can be contacted with the plating body with a uniform pushing force. Therefore, sealing performances of the inner seal and the outer seal can be maintained high. Accordingly, an issue that a portion other than the plating surface of the plating body is plated by entering of a plating solution into the aforementioned space can be prevented.

According to a seventh aspect of the present invention, there is provided an electroplating jig, wherein a metal plate is arranged between the first or second insulator plate and the conductive rubber.

According to the above configuration, when the plating body is sandwiched between the first insulator plate and the second insulator plate, the conductive rubber can be contacted with the plating body by the metal plate with a uniform pushing force. As a result, a local load applied to the plating body from the conductive rubber can certainly be prevented.

BRIEF DESCRIPTION OF THE DRAWINGS

The present invention will be described in further detail with reference to the accompanying drawings wherein.

DETAILED DESCRIPTION OF THE PREFERRED EMBODIMENT

Figure 1:
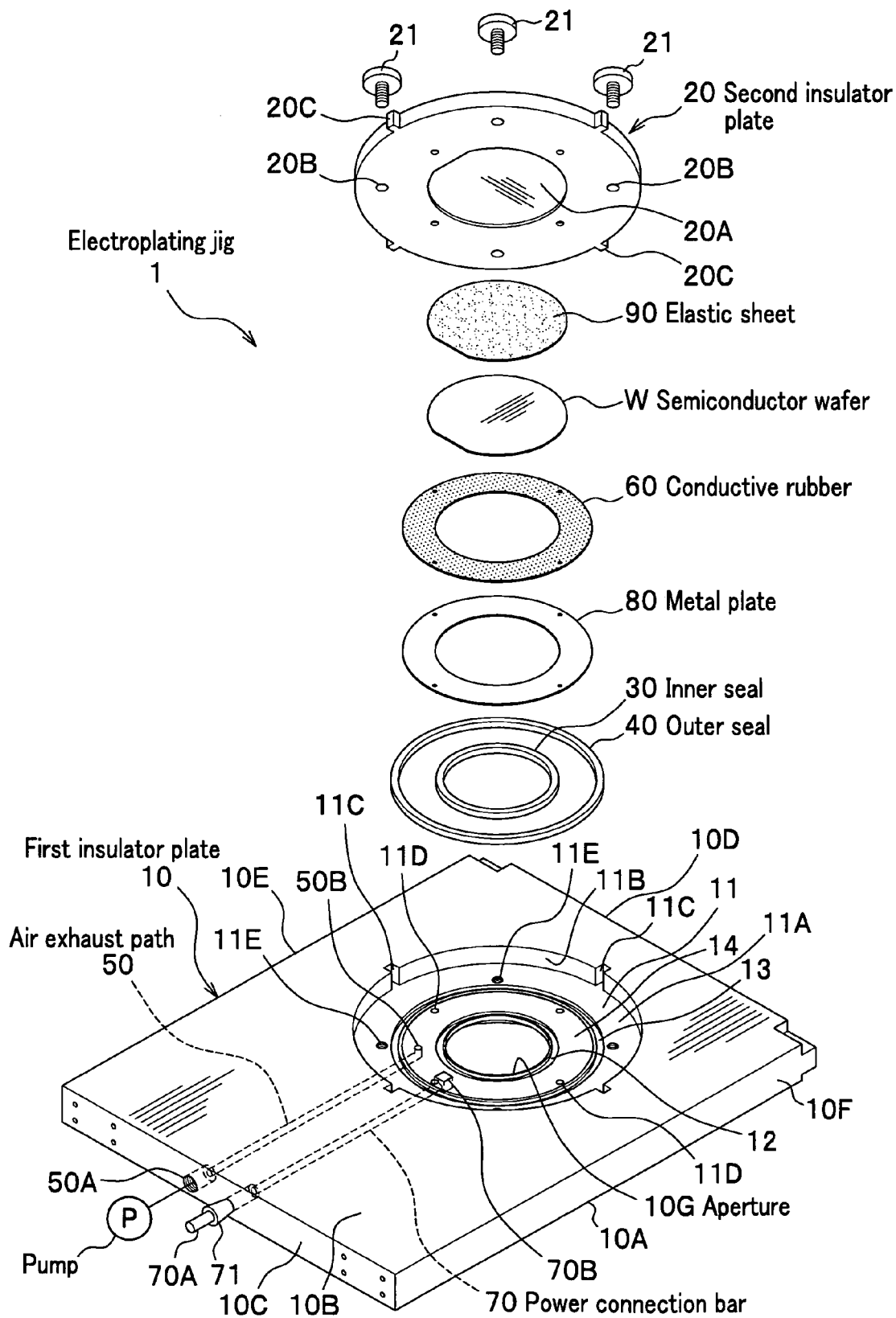
FIG. 1 is an exploded perspective view of an electroplating jig according to an embodiment of the present invention.
Figure 2:
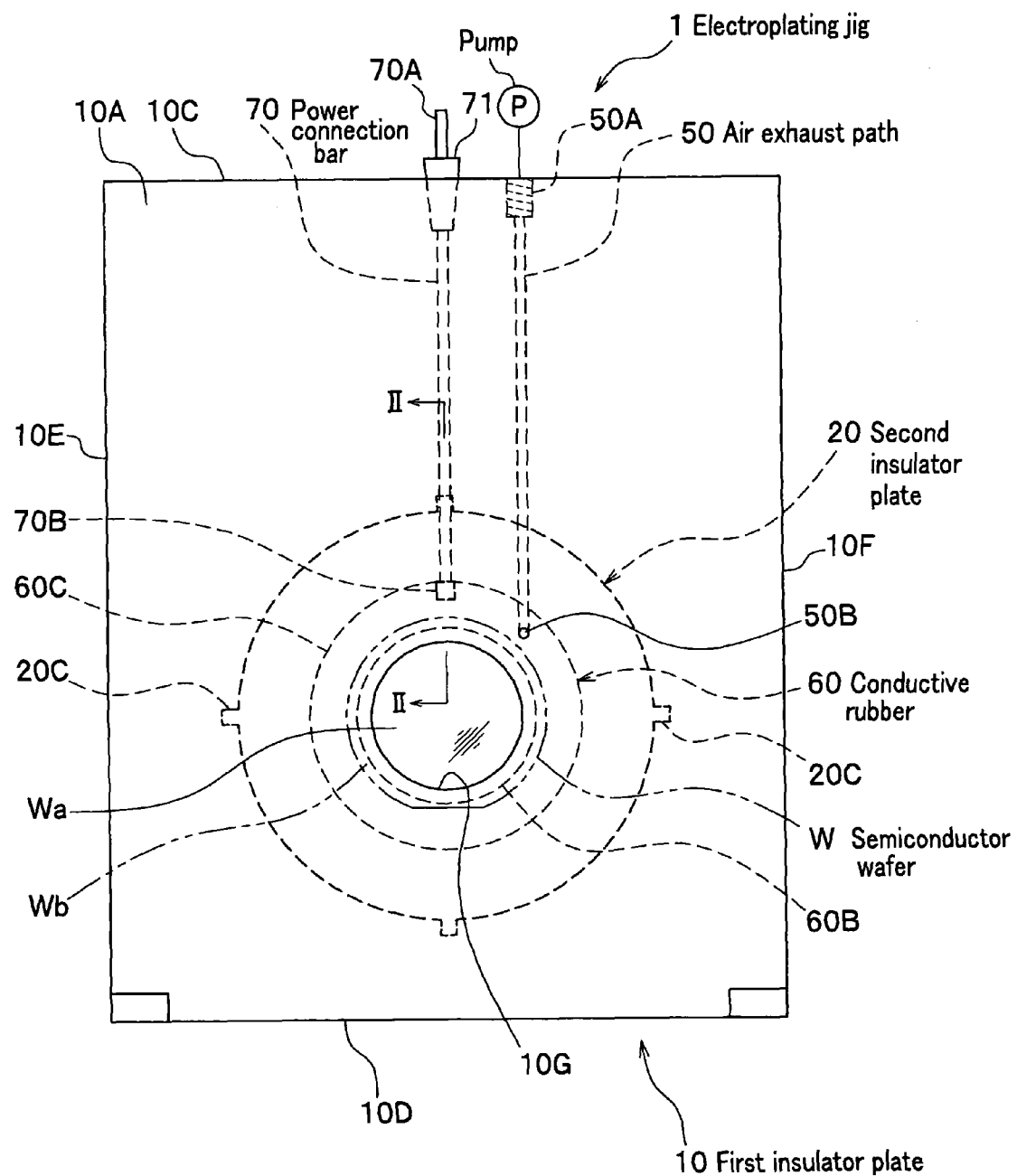
FIG. 2 is a plane view showing an electroplating jig according to the embodiment.
Figure 3:
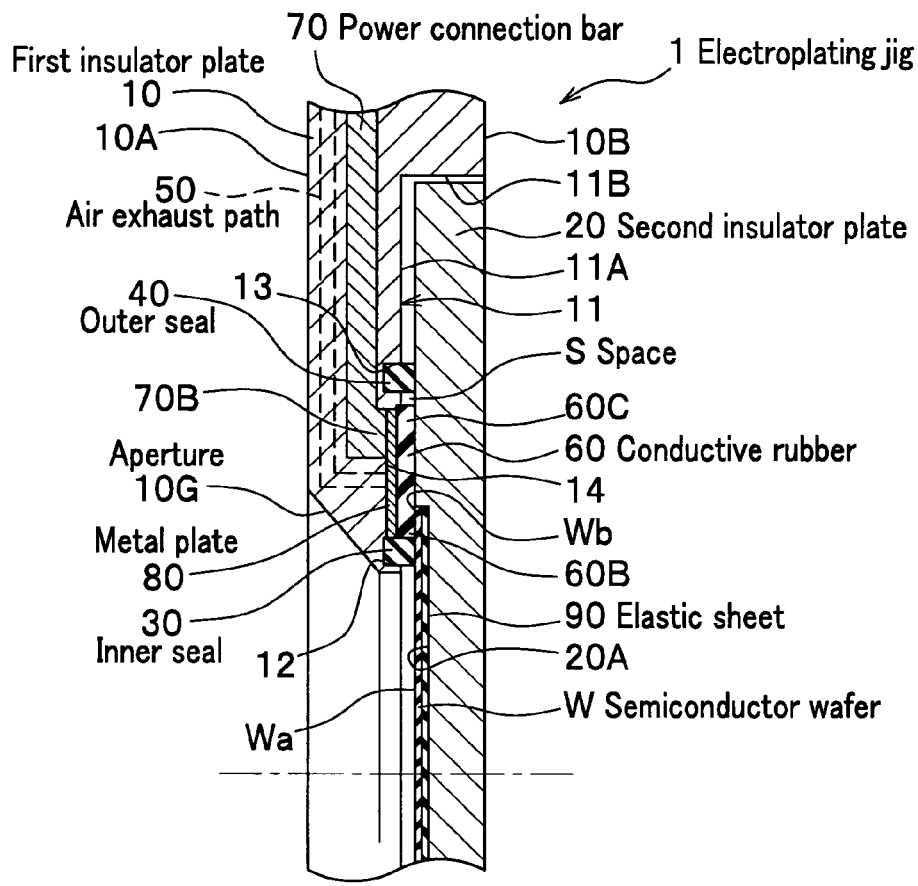
FIG. 3 is a partial enlarged cross sectional view of the electroplating jig according to the embodiment, viewed from a II-II direction shown with arrows in FIG. 2.
Figure 4:
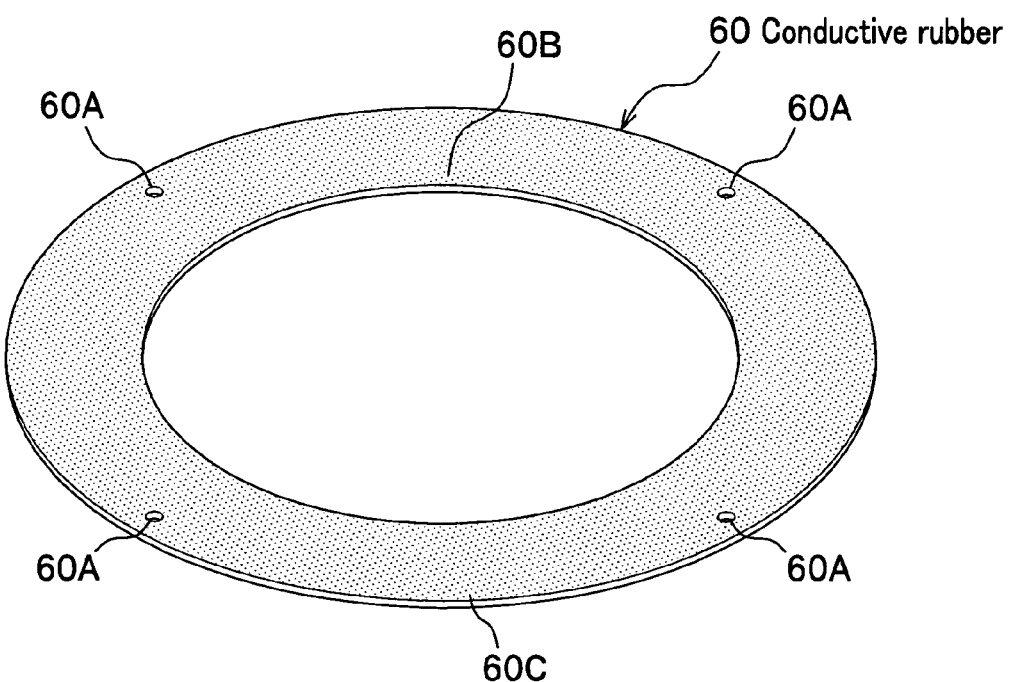
FIG. 4 is a perspective view showing a conductive rubber in FIG. 1 alone.
Figure 5:
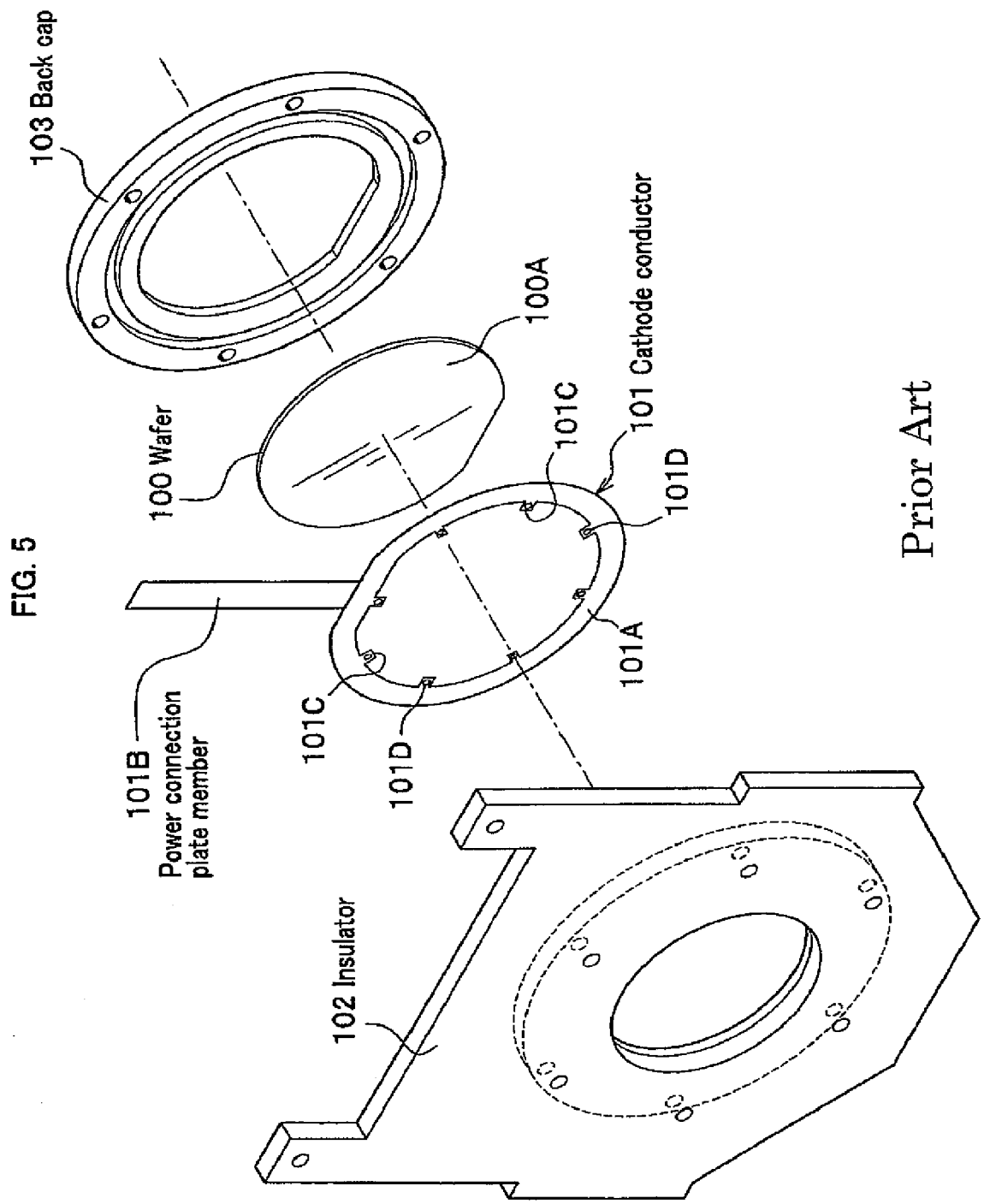
FIG. 5 is an exploded perspective view showing an electroplating jig according to a conventional technology.

An embodiment of the present invention will be explained in detail by referring to figures, as needed. FIG. 1 is an exploded perspective view of an electroplating jig according to an embodiment of the present invention. FIG. 2 is a plane view showing the electroplating jig according to the embodiment. FIG. 3 is a partial enlarged cross sectional view of the electroplating jig according to the embodiment, viewed from a II-II direction shown with allows in FIG. 2. FIG. 4 is a perspective view showing a conductive rubber in FIG. 1 alone.

As shown in FIG. 1 and FIG. 4, the electroplating jig 1 is mainly configured with a first insulator plate 10, a second insulator plate 20, an inner seal 30, an outer seal 40, an air exhaust path 50, and a conductive rubber 60 made of a conductive plate.

The first insulator plate 10 is formed in approximately a quadrangular plate body using insulator materials such as acrylics, and as shown in FIG. 1 and FIG. 3, includes a front surface 10A, a back surface 10B, and side surfaces 10C, 10D, 10E, and 10F (refer to FIG. 2). In the first insulator plate 10, approximately a circular aperture 10G is formed, and a surface Wa (refer to FIG. 2) to be plated (a plating surface Wa) of a semiconductor wafer, which is a body to be plated (a plating body) and will be described later, is exposed to (faced) outside through the aperture 10G.

In addition, on the back surface 10B of the first insulator plate 10, a fitting groove 11 of a circular hole having a bottom to which the second insulator plate 20 is to be fitted is formed, and the fitting groove 11 includes a bottom 11A and a side wall 11B. On the bottom 11A of the fitting groove 11, the aperture 10G is disposed in the center of the bottom 11A, and on the side wall 11B, four positioning grooves 11C, 11C, . . . are disposed. Further, a step 14 where is lower than the bottom 11A is formed in a portion surrounded by an inner seal fixing groove 12 and an outer seal fixing groove 13, which will be described later.

Here, on the bottom 11A of the fitting groove 11, the inner seal fixing groove 12 is formed positioned at a periphery of the aperture 10G. In addition, on the bottom 11A, the outer seal fixing groove 13, which is arranged in a concentric fashion with the inner seal fixing groove 12, is formed at outside of the inner seal fixing groove 12. Meanwhile, on the bottom 11A, a plurality of screw holes 11D, 11D, . . . are disposed at inside of the outer seal fixing groove 13 in circumferential direction with an interval, and also a plurality of bolt holes 11E, 11E, . . . are disposed at outside of the outer seal fixing groove 13 in circumferential direction with an interval.

The second insulator plate 20 is formed in approximately a circular plane body using insulator materials such as acrylics as with the first insulator plate 10, and a wafer housing concave 20A for fixing a semiconductor wafer by housing (fitting up) the wafer is formed in the central portion of the second insulator plate 20. In addition, in the second insulator 20, a plurality of bolt through holes 20B, 20B, . . . are disposed in circumferential direction with an interval, and also on a side surface of the second insulator plate 20, four protrusions 20C, 20C, . . . are disposed in circumferential direction with an interval and being faced with outside of the radial direction. Then, the second insulator plate 20 is positioned so that each bolt through hole 20B is located to a position corresponding to each bolt hole 11E. With the above configuration, the second insulator plate 20 is fixed to the fitting groove 11 by using four bolts 21, 21, . . . (three bolts are shown in FIG. 1).

As shown in FIG. 3, the inner seal 30 is positioned at a periphery of the aperture 10G of the first insulator plate 10, and arranged between the first insulator plate 10 and a semiconductor wafer W. The inner seal 30 is, as shown in FIG. 1, formed in a ring having approximately a quadrangular cross section by using such as resin materials, and fixed in the inner seal fixing groove 12 by fitting up. Accordingly, the inner seal 30 prevents entering of a plating solution into a perimeter surface Wb of a semiconductor wafer W, especially, into a contact portion between the perimeter surface Wb and the conductive rubber 60, by elastically contacting with cushion with a surface of the semiconductor wafer W as shown in FIG. 3.

As shown in FIG. 3, the outer seal 40 is formed between the first insulator plate 10 and the second insulator plate 20 so as to surround the conductive rubber 60 from outside. The outer seal 40 is, as with the inner seal 30, formed in a ring having approximately a quadrangular cross section by using such as resin materials, and fixed in the outer seal fixing groove 13. Accordingly, the outer seal 40 prevents, together with the inner seal 30, entering of the plating solution into, such as a contact portion between an edge 70B of a power connection bar 70 described later and the conductive rubber 60, and a contact portion between the perimeter surface Wb of the semiconductor wafer W and the conductive rubber 60, by elastically contacting with cushion with the second insulator plate 20.

As shown in FIG. 1 and FIG. 2, the air exhaust path 50 extends to a top and bottom direction (refer to FIG. 2) within the first insulator plate 10. A top edge side of the air exhaust path 50 forms a screw hole 50A located at the side surface 10C of the first insulator plate 10, and connected to a pump P. On the other hand, a bottom edge side (front end side) of the air exhaust path 50 is bended approximately in a L shape, and forms an open end 50B located at the step 14 of the first insulator plate 10. If the pump P is operated, as shown in FIG. 3, the air in a space S surrounded by the first insulator plate 10, the second insulator plate 20, the inner seal 30, and the outer seal 40 is exhausted through the air exhaust path 50, and the space S is maintained in negative pressure.

The conductive rubber 60 is formed in a ring plate using synthetic resins mixed with fine conductive particles, for example, rubber materials such as a silicone rubber which is mixed with fine metal particles and combines electrical conductivity and elasticity. On the conductive rubber 60, for example, four screw through holes 60A, 60A, . . . (refer to FIG. 4) are disposed in a circumferential direction with an interval.

Here, the conductive rubber 60 is housed by fitting up within the step 14 formed on the bottom 1A of the first insulator plate 10, and fixed to the step 14 together with a metal plate 80, which will be described later, by fixing a screw into the screw hole 11D through the screw through hole 60A. Therefore, the conductive rubber 60 is arranged, as shown in FIG. 3, between the first insulator plate 10 and the semiconductor wafer W, and also between the first insulator plate 10 and the second insulator plate 20, and an inner periphery 60B of the conductive rubber 60 is elastically contacted with the circumferential surface Wb of the semiconductor wafer W with surface contact by a uniform pushing force. In addition, the outer periphery 60C of the conductive rubber 60 is electrically connected to the edge 70B of the power connection bar 70 through the metal plate 80.

The power connection bar 70 extends downward (refer to FIG. 2) within the first insulator plate 10 from the side surface 10C of the first insulator plate 10, and a top edge 70A of the power connection bar 70 is connected to a cathode of a power source (not shown). Also, a bottom edge (front end) 70B of the power connection bar 70 is electrically connected to the metal plate 80 with surface contact. Therefore, an electric current from the power source is supplied to the semiconductor wafer W through the power connection bar 70 and metal plate 80. Meanwhile a symbol "71" is a sealing member for sealing between the power connection bar 70 and the first insulator plate 10. The sealing member 71 prevents the plating solution from leaking into around the conductive rubber 60 (including the space S) through a clearance between the power connection bar 70 and the first insulator plate 10.

The metal plate 80 is formed in a shape almost equal to the conductive rubber 60 using a metal material, such as phosphor bronze, and housed within the step 14 of the first insulator plate 10. The metal plate 80 is arranged between the conductive rubber 60 and the step 14 of the first insulator plate 10, and pushes a whole conductive rubber 60 to the semiconductor wafer W with a uniform pushing force in the circumferential direction, when the second insulator plate 20 is clamped on the first insulator plate 10 with the bolts 21.

A symbol "90" is an elastic sheet arranged between the second insulator plate 20 and the semiconductor wafer W. The elastic sheet 90 is formed in a shape almost equal to the semiconductor wafer W using a hard or soft elastic material, for example, composed of such as silicone rubbers and fluorine rubbers, and housed within the wafer housing concave 20A. Therefore, the elastic sheet 90 elastically accepts a load which is applied to the semiconductor wafer W by the conductive rubber 60.

According to the electroplating jig 1 configured with the embodiment of the present invention, the conductive rubber 60 composed of an elastic plate is elastically and widely contacted with the semiconductor wafer W with surface contact by inserting the conductive rubber 60 between the first insulator plate 10 and the semiconductor wafer W. Therefore, when the semiconductor wafer W is sandwiched between the first insulator plate 10 and the second insulator plate 20, the conductive rubber 60 functions as a cushion for the semiconductor wafer W. Accordingly, a load (pushing force) applied to the semiconductor wafer W from the conductive rubber 60 can certainly be reduced, thereby resulting in elimination of the aforementioned issue in the related art that the load is locally and concentratedly applied to the semiconductor wafer W. With the above, the semiconductor wafer W can be prevented from, such as breaking and damaging, thereby resulting in improvement of, for example, performance and reliability of the electroplating jig 1.

In addition, since the conductive rubber 60 is formed in the ring plate, the issue that the plating surface Wa of the semiconductor wafer W is covered with the conductive rubber 60 is removed, thereby resulting in certain plating of the plating surface.

Further, since the elastic sheet 90 is inserted between the semiconductor wafer W and the second insulator plate 20 so that the elastic sheet 90 is elastically contacted with the semiconductor wafer W from the back surface side (backside), the load applied to the semiconductor wafer W from the conductive rubber 60 can be elastically accepted by the elastic sheet 90, thereby resulting in further prevention of the local and concentrated load to the semiconductor wafer W by the cushion of the elastic sheet 90.

Furthermore, since the metal plate 80 which is harder than the conductive rubber 60 is inserted between the conductive rubber 60 and the step 14 of the first insulator plate 10, when the second insulator plate 20 is clamped to the first insulator plate 10, the whole conductive rubber 60 can be pushed to the semiconductor wafer W by the metal plate 80 with a uniform pushing force, thereby resulting in certain prevention of the local and concentrated load to the semiconductor wafer W by the conductive rubber 60.

In addition, the inner seal 30 for sealing a space between the first insulator plate 10 and the semiconductor wafer W is arranged on the periphery of the aperture 10G, and the outer seal 40 for sealing the first insulator plate 10 and the second insulator plate 20 is arranged on the periphery of the conductive rubber 60. And, in the first insulator plate 10, the air exhaust path 50 for maintaining the space S, which is surrounded by the first insulator plate 10, the second insulator plate 20, the inner seal 30, and the outer seal 40, in negative pressure is disposed. With the above, the space S can be maintained in negative pressure by exhausting the air in the space S by the pump P through the air exhaust path 50. As a result, the whole inner seal 30 can be contacted with the semiconductor wafer W with a uniform pushing force, and also the whole outer seal 40 can be contacted with the second insulator plate 20 with a uniform pushing force. Therefore, high sealing performances of the inner seal 30 and the outer seal 40 can be maintained. Then, the plating solution is prevented from entering into the space S, thereby preventing a portion (for example, the perimeter surface Wb) other than the plating surface of the semiconductor wafer W from plating. Accordingly, the performance and reliability of the electroplating jig 1 can be further improved.

Meanwhile, in the above embodiment, an example, where the conductive rubber 60 is contacted with surface contact with the perimeter surface Wb which is a front surface side of the semiconductor wafer W, has been explained, however, the present invention is not limited thereto. For example, the conductive rubber 60 may be contacted with surface contact with the backside (back surface side) which is an opposite side of the perimeter surface Wb of the semiconductor wafer W, by arranging the conductive rubber 60 between the semiconductor wafer W and the second insulator plate 20. In this case, the electric potential difference in the semiconductor wafer W can be suppressed to be small, thereby resulting in advantage that uneven plating of the semiconductor wafer W is not likely to happen.

In addition, in the embodiment, the semiconductor wafer W has been exemplified as a plating body for explanation, however, the present invention is not limited thereto. For example, a glass substrate, a ceramic substrate, a printed board, and an aluminum substrate may be used as the plating body. In case of the aluminum substrate, anodic oxidation can be conducted by connecting the substrate to the anode of power source through the conductive rubber 60.

Further, in the embodiment, a case, where the air exhaust path 50 is disposed in the first insulator plate 10, has been exemplified for explanation. However, the present invention is not limited thereto. For example, the air exhaust path 50 may be disposed in the second insulator plate 20.

Furthermore, in the embodiment, a case, where the metal plate 80 is arranged between the first insulator plate 10 and the conductive rubber 60, has been exemplified for explanation. However, the present invention is not limited to this configuration. For example, the metal plate 80 may be arranged between the conductive rubber 60 and the insulator plate 20, while arranging the conductive rubber 60 between the semiconductor wafer W and the second insulator plate 20.

What is claimed is:

1. An electroplating jig, comprising:
a first insulator plate having an aperture;
a second insulator plate sandwiching a body to be plated between the first insulator plate and the second insulator plate so that the body to be plated is faced outside from the aperture; and
a conductive plate for conducting electric current supplied from outside to the body to be plated, the conductive plate being arranged between the first insulator plate and the body to be plated;
an inner seal arranged on a periphery of the aperture, for sealing between the first insulator plate and the second insulator plate and the body to be plated;
an outer seal arranged on a perimeter of the conductive plate, for sealing between the first insulator plate and the second insulator plate; and
an air exhaust path disposed at least in one of the first insulator plate and the second insulator plate, for maintain a space surrounding the first insulator plate, the second insulator plate, the inner seal, and the outer seal in negative pressure,
wherein the conductive plate is formed using a conductive rubber formed in a ring plate shape contacting elastically with the body to be plated; and
a metal plate formed in a ring plate shape is arranged between the first or second insulator plate and the conductive rubber.

2. The electroplating jig according to claim 1, wherein the conductive rubber is arranged so as to surround the aperture of the first insulator plate from a perimeter of the aperture.

3. The electroplating jig according to claim 1, wherein an elastic sheet which elastically contacts with the body to be plated is arranged between the second insulator plate and the body to be plated.

4. The electroplating jig according to claim 2, wherein an elastic sheet which elastically contacts with the body to be plated is arranged between the second insulator plate and the body to be plated.

5. An electroplating jig, comprising:
a first insulator plate having an aperture;
a second insulator plate sandwiching a body to be plated between the first insulator plate and the second insulator plate so that the body to be plated is faced outside from the aperture; and a conductive plate for conducting electric current supplied from outside to the body to be plated, the conductive plate being arranged between the second insulator plate and the body to be plated;

an inner seal arranged on a periphery of the aperture, for sealing between the first insulator plate and the second insulator plate and the body to be plated;

an outer seal arranged on a perimeter of the conductive plate, for sealing between the first insulator plate and the second insulator plate; and an air exhaust path disposed at least in one of the first insulator plate and the second insulator plate, for maintain a space surrounding the first insulator plate, the second insulator plate, the inner seal, and the outer seal in negative pressure, wherein the conductive plate is made of a conductive rubber which is formed in a ring plate shape and contacts elastically with the body to be plated; and a metal plate fanned in a ring plate shape is arranged between the first or second insulator plate and the conductive rubber.

6. The electroplating jig according to claim 1, wherein the body to be plated is any one of a semiconductor wafer, a glass substrate, a ceramic substrate, a print board, and an aluminum substrate.

7. The electroplating jig according to claim 2, wherein the body to be plated is any one of a semiconductor wafer, a glass substrate, a ceramic substrate, a print board, and an aluminum substrate.

8. The electroplating jig according to claim 3, wherein the body to be plated is any one of a semiconductor wafer, a glass substrate, a ceramic substrate, a print board, and an aluminum substrate.

9. The electroplating jig according to claim 4, wherein the body to be plated is any one of a semiconductor wafer, a glass substrate, a ceramic substrate, a print board, and an aluminum substrate.

* * * * *